(12) United States Patent
Check

(10) Patent No.: US 6,519,127 B1
(45) Date of Patent: Feb. 11, 2003

(54) SOLID STATE SAFETY RELAY

(75) Inventor: Kenneth A. Check, San Jose, CA (US)

(73) Assignee: Compaq Computer Corporation, Houston, TX (US)

(*) Notice: Subject to any disclaimer, the term of this patent is extended or adjusted under 35 U.S.C. 154(b) by 96 days.

(21) Appl. No.: 09/679,324

(22) Filed: Oct. 3, 2000

(51) Int. Cl.[7] .............................................. H02H 3/00
(52) U.S. Cl. ..................................... 361/100; 361/101
(58) Field of Search ................................ 361/101, 100; 320/128–136; 324/771; 307/246; 363/59

(56) References Cited

U.S. PATENT DOCUMENTS

| | | | |
|---|---|---|---|
| 5,004,970 A | | 4/1991 | Barou .......................... 323/277 |
| 5,130,561 A | | 7/1992 | Elliott et al. ................... 307/31 |
| 5,138,186 A | * | 8/1992 | Dumbovic ................... 307/246 |
| 5,365,420 A | | 11/1994 | Cadman ........................ 363/50 |
| 5,574,633 A | * | 11/1996 | Prater ........................... 363/59 |
| 5,703,463 A | | 12/1997 | Smith ........................... 320/134 |
| 5,764,032 A | * | 6/1998 | Moore .......................... 320/126 |
| 5,789,902 A | | 8/1998 | Abe et al. ..................... 320/134 |
| 5,867,008 A | | 2/1999 | Du et al. ...................... 320/136 |
| 5,883,495 A | * | 3/1999 | Smith et al. .................. 320/128 |
| 5,898,293 A | | 4/1999 | Tamai et al. .................. 320/136 |
| 5,909,103 A | * | 6/1999 | Williams ...................... 320/134 |
| 5,949,667 A | | 9/1999 | Limbert ........................ 363/65 |
| 5,982,145 A | | 11/1999 | Eguchi ......................... 320/128 |
| 6,150,797 A | * | 11/2000 | Mukainakano ............... 320/134 |
| 6,242,893 B1 | * | 6/2001 | Freedman .................... 320/135 |

OTHER PUBLICATIONS

Linear Technology data sheet, "LTC 1623 SMBus Dual High Side Switch Controller", 1997, p. 12.*
Linear Technology data sheet, Application Note 53 "Micropower High Side MOSFET Drivers", 1993, p. 10.*

* cited by examiner

*Primary Examiner*—Michael Sherry
*Assistant Examiner*—Pia Tibbits
(74) *Attorney, Agent, or Firm*—Fenwick & West LLP

(57) ABSTRACT

A solid state safety relay comprises: a first driver circuit; a second driver circuit; a charge disconnect transistor coupled to the first driver circuit and configured to control the flow of current along a current path; a first discharge disconnect transistor coupled to the first driver circuit and configured to control the flow of current along the current path; and a second discharge disconnect transistor coupled to the second driver circuit and configured to control the flow of current along the current path. A method of isolating an energy source from a circuit current path, comprises: turning off a first discharge disconnect transistor coupled to the circuit current path; and turning off a second discharge disconnect transistor coupled to the circuit current path to permit isolation of the energy source from the circuit current path if either one of the first discharge disconnect transistor or the second discharge disconnect transistor fails.

12 Claims, 4 Drawing Sheets

SOLID STATE SAFETY RELAY

OPTO-ISOLATOR

ENERGY DISCONNECT CIRCUIT

SOLID STATE SAFETY RELAY

FIELD OF THE INVENTION

The present invention relates generally to the field of solid state safety relays, and more particularly to a solid state safety relay with two (redundant) drive circuits for driving MOSFET transistors that function as switches.

BACKGROUND OF THE INVENTION

Mechanical relays are used in various applications. For example, mechanical relays are used to control the flow of current across wires in a circuit. However, conventional mechanical relays have various mechanical limitations. For example, in most cases, mechanical relays cannot operate reliably in both "wet" and "dry" circuit conditions. A wet circuit is defined as a circuit that, by virtue of the current/voltage applied across the relay contacts, has the ability to clean its own contacts. A dry circuit is defined as a circuit that applies very low power across the relay contacts, and, as a result, is unable to clean its own contacts.

Another limitation of conventional mechanical relays is that they are subject to many forms of environmental contamination and physical degradation.

The above drawbacks are not acceptable if the mechanical relay is used in particular critical applications such as safety devices. The above limitations of mechanical relays may cause a safety device to fail during operation.

Thus there is a need for a solid state based relay that would overcome the many drawbacks and limitations of conventional mechanical relays.

SUMMARY OF THE INVENTION

The present invention broadly provides a solid state safety relay which includes redundant circuitry for blocking the flow of current in the discharge direction. The redundant circuitry enables an energy source (e.g., a battery) to be disconnected from the relay circuit regardless of any single point of failure that may occur in the relay circuit. As a result, the safety relay is useful in critical applications such as safety devices.

The present invention broadly provides in one embodiment a solid state safety relay comprising: a first driver circuit; a second driver circuit; a charge disconnect transistor coupled to the first driver circuit and configured to control the flow of current along a current path; a first discharge disconnect transistor coupled to the first driver circuit and configured to control the flow of current along the current path; and a second discharge disconnect transistor coupled to the second driver circuit and configured to control the flow of current along the current path. The charge disconnect transistor controls the flow of current in the charge direction, while each of the discharge disconnect transistors controls the flow of current in the discharge direction.

In another embodiment, the solid state safety relay further comprises: a third driver circuit coupled to the first and second driver circuit; a second charge disconnect transistor coupled to the third driver circuit and configured to control the flow of current along a second current path; and a third discharge disconnect transistor coupled to the third driver circuit and configured to control the flow of current along the second current path.

The present invention also provides in another embodiment a solid state safety relay comprising: a first driver circuit; a second driver circuit; a first discharge disconnect transistor coupled to the first driver circuit and configured to control the flow of current along the current path; and a second discharge disconnect transistor coupled to the second driver circuit and configured to control the flow of current along the current path.

The present invention also provides in another embodiment a method of isolating a battery source from a circuit current path, comprising: turning off a first discharge disconnect transistor coupled to the circuit current path; and turning off a second discharge disconnect transistor coupled to the circuit current path to permit isolation of the battery source from the circuit current path if either one of the first discharge disconnect transistor or the second discharge disconnect transistor fails.

DETAILED DESCRIPTION OF THE PREFERRED EMBODIMENTS

Those of ordinary skill in the art will realize that the following description of the preferred embodiments is illustrative only and not in any way limiting. Other embodiments of the invention will readily suggest themselves to those skilled in the art.

Figure 1:
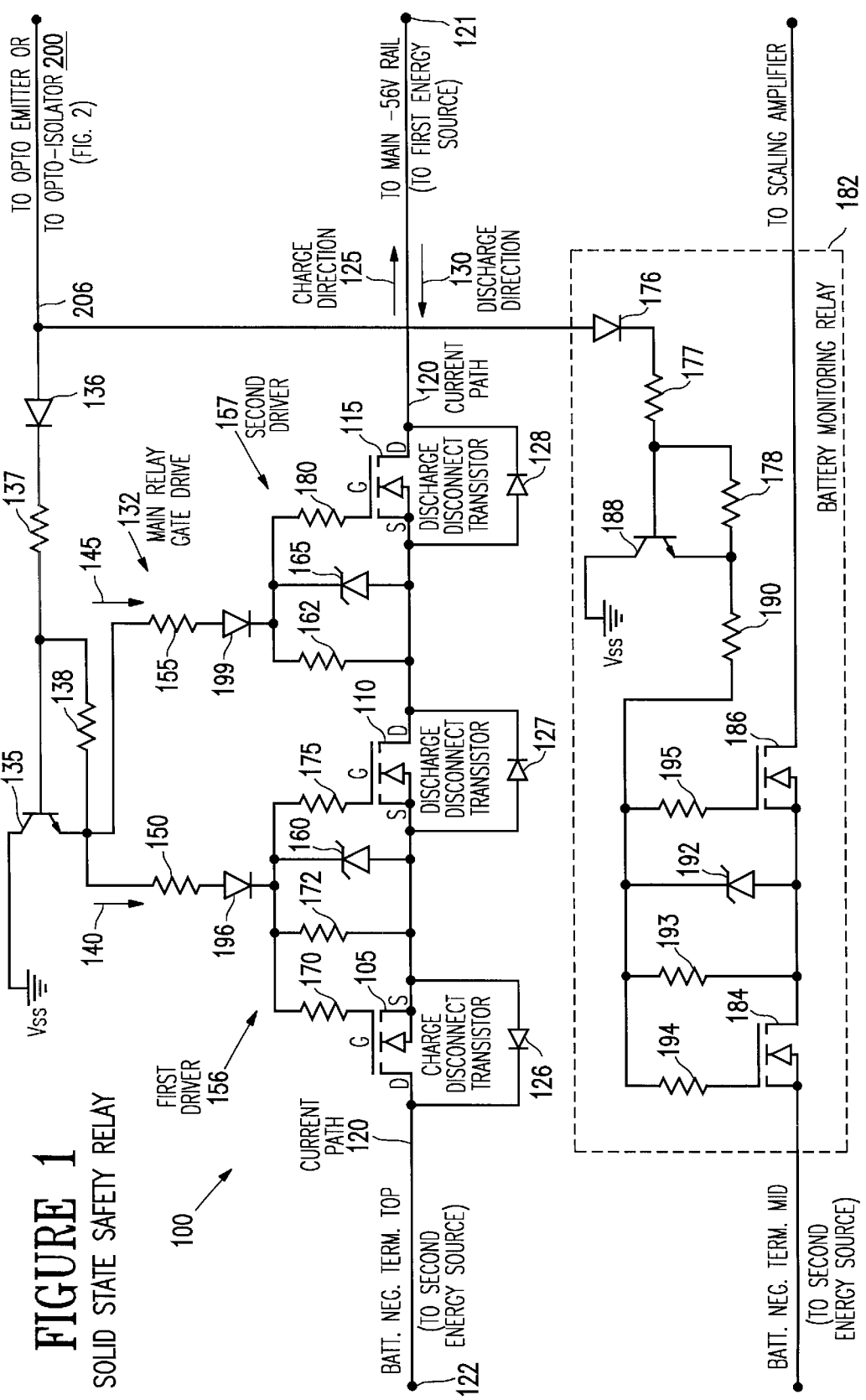
FIG. 1 is a schematic circuit diagram of a solid state safety relay in accordance with an embodiment of the present invention.

FIG. 1 is a schematic circuit diagram of a solid state safety relay 100 in accordance with an embodiment of the present invention. The relay 100 could be used in various applications such as a power switch for battery charge and discharge circuits and in a safety switch. The relay 100 could also be a key component of a high reliability change over circuit. Additionally, the relay 100 could function as a bidirectional control circuit. The solid state safety relay 100 includes charge disconnect transistor 105 and discharge disconnect transistors 110 and 115, all of which control the flow and direction of current along a high current path 120. In one embodiment, the transistors 105, 110, and 115 are MOSFET transistors with low on-resistance values. However, other types of transistors may also be used in the relay 100. The transistor 105 permits a first energy source (coupled to terminal 121) to charge a second energy source (coupled to terminal 122) by permitting current to flow along path 120 in the charge direction 125. As an example, the first energy source may be a main power supply source, while the second energy source may be a battery. Other types of energy sources may be used for the first and second energy sources. The transistors 110 and 115 permit the second energy source (e.g., a battery) to discharge by permitting current to flow along path 120 in the discharge direction 130. Thus, the transistor 105 replaces relay contacts in the charge direction 125, while the transistors 110 and 115 replace relay contacts in the discharge direction 130. The circuit in relay 100 is "wet" while the second energy source is being charged, and "dry" while the second energy source is completely charged and is in the "float" mode. The relay 100 works for both applications.

In FIG. 1, since the first and second energy sources are negative with respect to ground (Vss), current flows in the opposite direction (which is not normally considered the intuitive viewpoint). In order to charge the second energy source, current must flow away from the top battery negative terminal via path 120 in the charge direction 125. All three transistors 105, 110, and 115 must be enhanced (conducting) in order for charging of the second energy source to occur. When charging the second energy source, transistors 110 and 115 are conducting current in the reverse direction (i.e., in direction 125 or the source-to-drain direction). This condition is not a problem since MOSFETs are symmetrical and will conduct current in both directions. If current is flowing in the reverse direction (source-to-drain direction) and the MOSFET is turned off, the voltage across the MOSFET will rise to one diode drop. This diode drop is due to the intrinsic body diode which is due to an artifact of the silicon. In FIG. 1, the transistors 105, 110, and 115 are shown symbolically with body diodes 126, 127, and 128, respectively. Since all transistors 105, 110, and 115 turn on and turn off together, the transistors 110 and 115 act to block the flow of current in charge direction 125. The transistor 105 will act to block the flow of current in the discharge direction 130.

As shown in FIG. 1, the discharge path 130 is in the opposite direction from the charge path 125. Since all transistor 105, 110, and 115 are symmetrical, all that is required to change the direction of the current flow is the location of the driving potential or the electromotive force (EMF) (i.e., the first energy source or the second energy source). In other words, when the first energy source is supplying, the second energy source is at a lower potential. Therefore, current flows from the first energy source into, for example, the positive terminal of the second energy source, and the system incorporating the solid state safety relay 100 is in the charging state. When the first energy source is not supplying, the potential of the second energy source is the highest in the system, and current flows from the positive terminal of the second energy source into the system and the system is in the discharge state.

Alternatively, the path 120 may be coupled to the positive terminal of the second energy source (e.g., battery) and to the positive terminal of the first energy source. In this particular circuit configuration, the charge and discharge directions would be reversed from those shown in FIG. 1.

Figure 2:
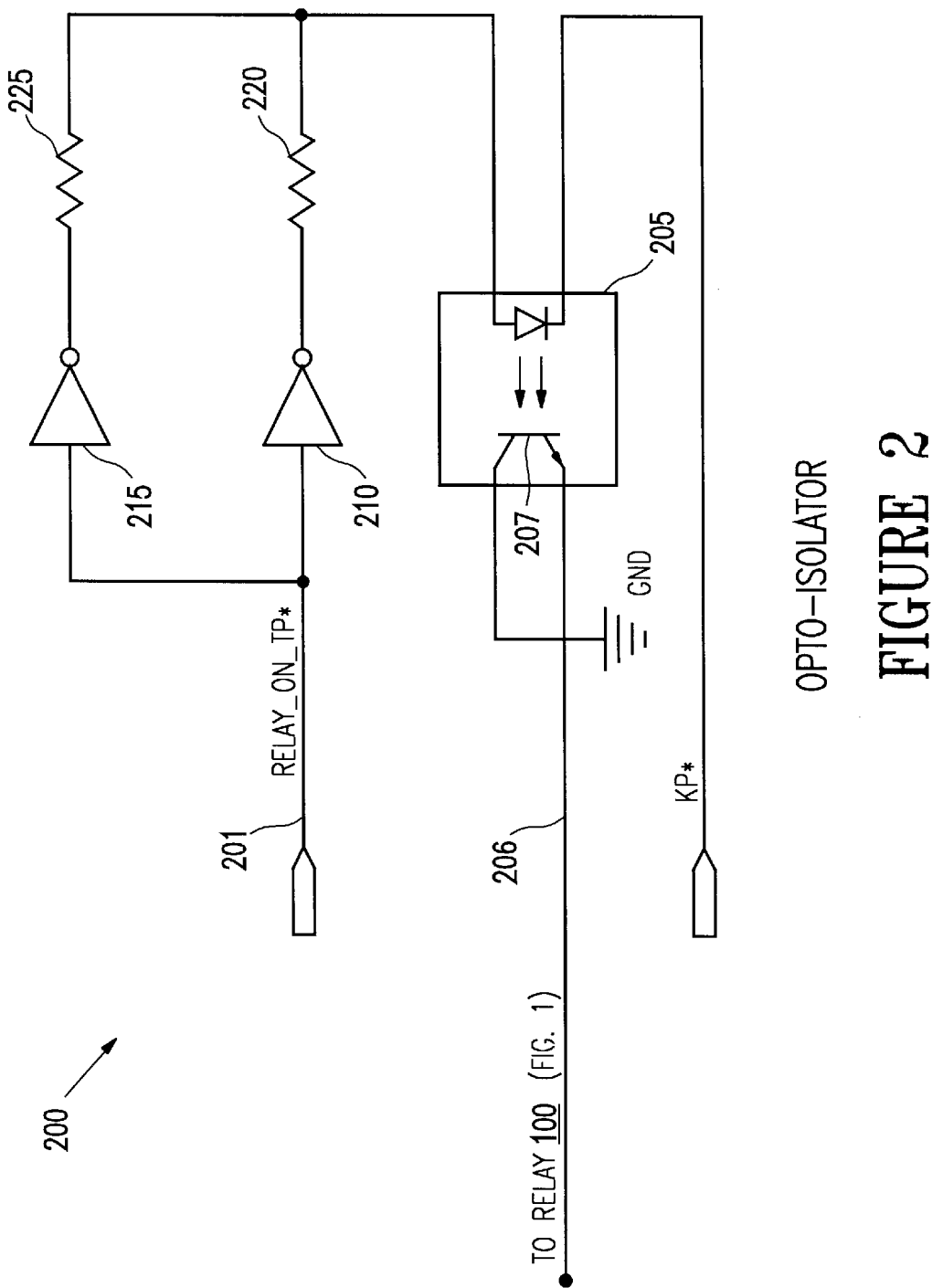
FIG. 2 is a schematic circuit diagram of an opto-isolator which is coupled to the solid state safety relay in FIG. 1.

The solid state safety relay 100 further comprises a main relay gate drive circuit 132 including a first driver circuit 156 and a second driver circuit 157. The main relay gate drive circuit 132 includes a transistor 135 which is driven by, for example, an opto-isolator 200 (FIG. 2). The opto-isolator 200 is driven by, for example, a power and monitor control unit (PMCU) on-board router which is manufactured by Compaq Computer Corporation, Cupertino, Calif. When the opto-isolator 200 turns on, the transistor 135 forces current 140 and 145 to flow across resistors 150 and 155, respectively. The current 140 flowing across the resistor 150 is received by the first driver circuit 156, while the current 145 flowing across the transistor 155 is received by the second driver circuit 157. These current flows develop a voltage across the gates of transistors 105, 110, and 115. As a result, the transistors 105, 110, and 115 are fully enhanced. The Zener diodes 160 and 165 ensure that the voltage across the gates of transistors 105, 110, and 115 do not exceed the rated voltage values of the gates. The resistors 170, 175, and 180 prevent the gates of transistors 105, 110, and 115 from ringing during transitions. The diodes 196 and 199 block the possibility of any current flowing from the gate of one transistor to the gate of the other transistors. Therefore, the discharge transistor 110 is isolated from the discharge transistor 115.

As an option, the solid state safety relay 100 further comprises a battery monitoring relay 182 which monitors the second energy source and isolates the PMCU battery monitor circuit (not shown) from the second energy source when the opto-isolator 200 has instructed the main relay circuit 132 to be in the off state (i.e., current does not flow across path 120). The battery monitoring relay 182 includes two transistors 184 and 186. A transistor 188 turns on by command or control signal from the opto-isolator 200. A resistor 190 develops the gate voltage across transistors 184 and 186. A Zener diode 192 limits the maximum voltage that can be imposed across the gates of transistors 184 and 186. Additionally, the resistors 194 and 195 prevent the gates of transistors 184 and 186, respectively, from ringing.

As shown in FIG. 1, two discharge disconnect transistors 110 and 115 are included in the solid state safety relay 100. Two discharge disconnect transistors 110 and 115 are used because MOSFETS have intrinsic (body) diodes from source to drain. Therefore, true isolation, similar to a function of a relay, is not achievable with use of just one MOSFET. The "back-to-back" configuration of MOSFETS 110 and 115 in FIG. 1 solves the intrinsic diode problem. The reason two MOSFETS 110 and 115 are used in the discharge direction is a safety matter. In other words, in order for any solid state relay 100 to be viable in safety relay applications, the solid state safety relay must insure that the second energy source is disconnected from all circuits regardless of any single point of failure. In order to accomplish this function, the two discharge disconnect transistors 110 and 115 are used. In the event that one discharge disconnect transistor shorts, the other transistor will act to isolate the first energy source from all circuits. For example, the discharge disconnect transistor 115 may short if the discharge disconnect transistor 115 is off.

The charge disconnect transistor 105 prevents charging of the second energy source. Note that in the charge mode, current may still flow in the charge direction 125 via the body diodes 127 and 128, even if the transistors 110 and 115 are off. Therefore, the charge disconnect transistor 105 can block the flow of current in the charge direction 125.

The discharge disconnect transistors 110 and 115 prevent discharge of the second energy source. In the event that one of the transistors 110 and 115 fails, the non-failing transistor will be able to block the flow of current in the discharge direction 130.

In the embodiment shown in FIG. 1, even if the second energy source voltage is considered a safety extra low voltage (SELV), the amount of energy the that the second energy source is capable of producing requires this level of protection.

No fault can render the solid state safety relay 100 unsafe. The relay 100 is used, for example, to disconnect the second energy source (e.g., a battery) for an emergency power off condition or a normal system power down.

As also shown in FIG. 1, the two separate drive circuits 156 and 157 are used to ensure that a failing discharge transistor cannot affect the gate drive of the other discharge transistor. For example, if the gate drive circuit 156 or discharge transistor 110 fails, the gate drive circuit 157 and discharge transistor 115 are not affected. If the gate drive circuit 157 or discharge transistor 115 fails, the gate drive circuit 156 and discharge transistor 110 are not affected.

FIG. 2 is a schematic circuit diagram of an opto-isolator 200 coupled to the solid state safety relay 100. Information from the system is received by line 201 and inverted by inverters 210 and 215. Thus, a low is signal at line 201 results in a high output signals generated by inverters 210 and 215. The high signals from inverters 210 and 215 activate the opto-LED in module 205. The opto-LED emits light which activates the base of photo-transistor 207, and as a result, the photo-transistor 207 conducts. Since the phototransistor 207 is conducting, the emitter of transistor 207 and line.206 are pulled to ground. As shown in FIG. 1, line 206 is coupled to the transistor 135.

Figure 3:
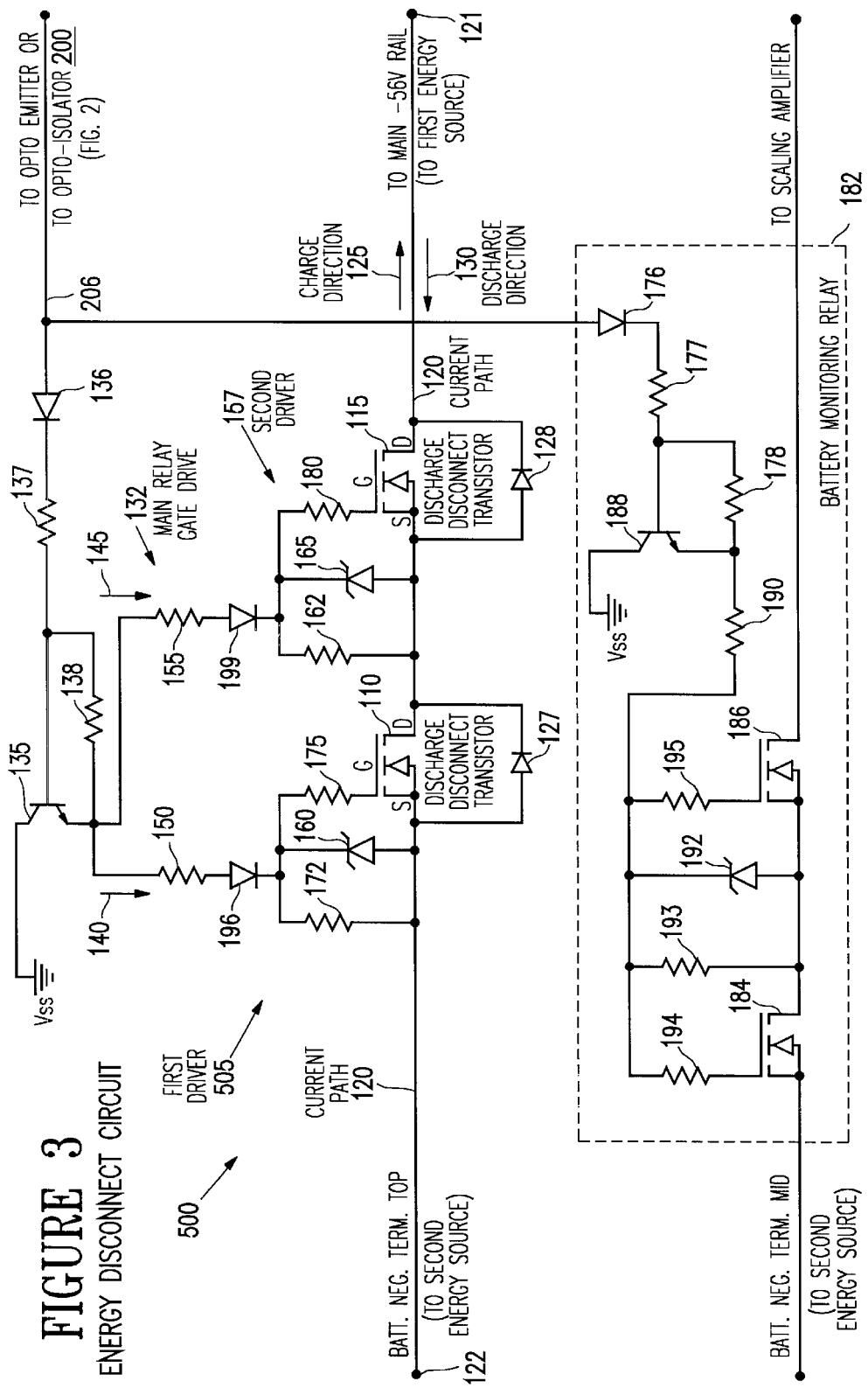
FIG. 3 is a schematic circuit diagram of a solid state safety relay in accordance with another embodiment of the present invention.

FIG. 3 is a schematic circuit diagram of an energy disconnect circuit 500 in accordance with another embodiment of the present invention. All elements shown in FIG. 1 are shown in FIG. 3 except the charge disconnect transistor 105 and the driver circuit 156. The charge disconnect transistor 105 has been omitted, and, as a result, a driver circuit 505 only drives the discharge disconnect transistor 110. Thus, energy disconnect circuit 500 permits discharge of the second energy source and insures that, in certain conditions, the second energy source is isolated from the circuitry of circuit 500. As in FIG. 1, the redundant discharge transistors 110 and 115 and the separate driver circuits 505 and 157 insure that no fault can render the circuit 500 unsafe.

Figure 4:
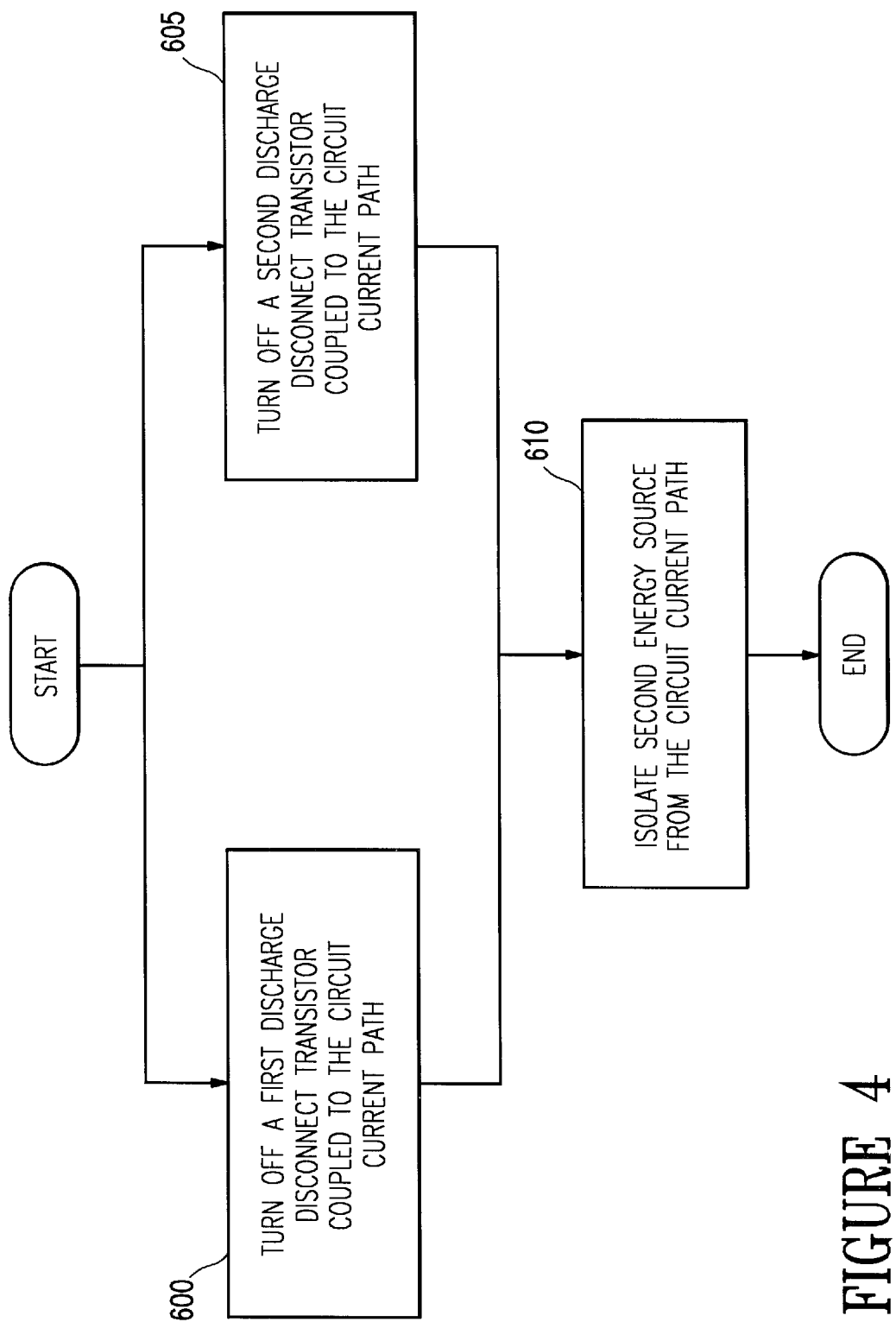
FIG. 4 is a flowchart diagram of a method of isolating a battery source from a circuit current path, in accordance with another embodiment of the present invention.

FIG. 4 is a flowchart diagram of a method of isolating the second energy source from a circuit current path, in accordance with another embodiment of the present invention. A first discharge disconnect transistor coupled to the circuit current path is turned off 600, while a second discharge disconnect transistor coupled to the circuit current path is also turned off 605. As a result, the second energy source is isolated 610 from the circuit current path if either of the first discharge disconnect transistor or the second discharge disconnect transistor fails.

Thus, while the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the scope of the invention as set forth.

Table 1 includes example values or identifiers for the components referenced in the table and illustrated in, for example FIGS. 1–3.

TABLE 1

| Reference Numeral | Description |
| --- | --- |
| 105 | IRF3205 |
| 110 | IRF3205 |
| 115 | IRF3205 |
| 135 | 2n4401 |
| 136 | MMBD914 |
| 137 | 6.4 kΩ |
| 138 | 47 kΩ |
| 150 | 18 kΩ |
| 155 | 18 kΩ |
| 160 | 15 V |
| 162 | 100 kΩ |
| 165 | 15 V |
| 170 | 10 Ω |
| 172 | 100 kΩ |
| 175 | 10 Ω |
| 176 | MMBD914 |
| 177 | 6.4 kΩ |
| 178 | 47 kΩ |
| 180 | 10 Ω |
| 184 | 2n7002 |

TABLE 1-continued

| Reference Numeral | Description |
| --- | --- |
| 186 | 2n7002 |
| 188 | 2n4401 |
| 190 | 27.5 kΩ |
| 192 | 9.1 V |
| 193 | 100 kΩ |
| 194 | 10 Ω |
| 195 | 10 Ω |
| 196 | MMBD914 (018093) |
| 199 | MMBD914 |
| 205 | PC356T |
| 220 | 510 1/10 W 5% |
| 225 | 510 1/10 W 5% |

What is claimed is:

1. A solid state safety relay comprising:

a first driver circuit;

a second driver circuit;

a charge disconnect transistor coupled to the first driver circuit and configured to control current flow in a charge direction of a current path;

a first discharge disconnect transistor coupled to the first driver circuit and configured to control current flow in a discharge direction of the current path; and a second discharge disconnect transistor coupled to the second driver circuit and configured to control current flow in the discharge direction of the current path.

2. The solid state safety relay of claim 1 wherein the charge disconnect transistor is a MOSFET.

3. The solid state safety relay of claim 1 wherein the first discharge disconnect transistor is a MOSFET.

4. The solid state safety relay of claim 1 wherein the second discharge disconnect transistor is a MOSFET.

5. The solid state safety relay of claim 1 further comprising:

a third driver circuit coupled to the first and second driver circuit;

a second charge disconnect transistor coupled to the third driver circuit and configured to control current flow in a charge direction of a second current path; and a third discharge disconnect transistor coupled to the third driver circuit and configured to control current flow in a discharge direction of the second current path.

6. The solid state safety relay of claim 1 further comprising:

an opto-isolator circuit configured to drive at least one of the first driver circuit and the second driver circuit.

7. A method of isolating an energy source from a circuit current path, comprising:

turning off a first discharge disconnect transistor coupled to the circuit current path; and turning off a second discharge disconnect transistor coupled to the circuit current path to permit isolation of the energy source from the circuit current path if either one of the first discharge disconnect transistor or the second discharge disconnect transistor fails.

8. An energy disconnect circuit, comprising:

a first driver circuit;

a second driver circuit;

a first discharge disconnect transistor coupled to the first driver circuit and configured to control current flow in a discharge direction of a current path; and a second discharge disconnect transistor coupled to the second driver circuit and configured to control current flow in the discharge direction of the current path.

9. The energy disconnect circuit of claim 8 wherein the first discharge disconnect transistor is a MOSFET.

10. The energy disconnect circuit of claim 8 wherein the second discharge disconnect transistor is a MOSFET.

11. The energy disconnect circuit of claim 8 further comprising:
   a third driver circuit coupled to the first and second driver circuit;
   a charge disconnect transistor coupled to the third driver circuit and configured to control current flow in a charge direction of a second current path; and
   a third discharge disconnect transistor coupled to the third driver circuit and configured to control current flow in a discharge direction of the second current path.

12. The energy disconnect circuit of claim 8 further comprising:
   an opto-isolator circuit configured to drive at least one of the first driver circuit and the second driver circuit.

* * * * *